United States Patent
Asano et al.

(10) Patent No.: US 6,891,267 B2
(45) Date of Patent: May 10, 2005

(54) SEMICONDUCTOR SWITCHING CIRCUIT DEVICE

(75) Inventors: Tetsuro Asano, Ora-gun (JP); Mikito Sakakibara, Osato-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 70 days.

(21) Appl. No.: 10/414,492

(22) Filed: Apr. 16, 2003

(65) Prior Publication Data

US 2004/0017701 A1 Jan. 29, 2004

(30) Foreign Application Priority Data

Apr. 17, 2002 (JP) .......................................... 2002-114960

(51) Int. Cl.[7] .............................................. H01L 23/34
(52) U.S. Cl. ........................ 257/728; 333/204; 333/219; 358/213
(58) Field of Search ................................. 333/204, 219; 358/213

(56) References Cited

U.S. PATENT DOCUMENTS

| | | | |
|---|---|---|---|
| 4,407,010 A | * 9/1983 | Baji et al. ................... | 348/301 |
| 5,142,255 A | * 8/1992 | Chang et al. ................ | 333/204 |
| 5,262,871 A | * 11/1993 | Wilder et al. ................ | 348/307 |
| 6,577,374 B1 | * 6/2003 | Nakata et al. ............... | 349/156 |

* cited by examiner

*Primary Examiner*—Michael Tran
*Assistant Examiner*—Mai-Huong Tran
(74) *Attorney, Agent, or Firm*—Morrison & Foerster LLP

(57) ABSTRACT

A semiconductor switching circuit device includes a field effect transistor having a source electrode, a gate electrode and a drain electrode, a first electrode pad connected to the source electrode or the drain electrode, and a second electrode pad connected to the source electrode or the drain electrode which is not connected to the first electrode pad. The device also includes a third electrode pad receiving a DC voltage and applying the DC voltage to the field effect transistor, a first insulating layer covering the field effect transistor, a metal layer disposed above the first insulating layer and connected to the third electrode pad, and a second insulating layer disposed on the metal layer. The third electrode pad may be a control terminal pad, a ground terminal pad or a terminal pad receiving a constant DC power voltage. The metal layer may be a flat sheet, a lattice or a comb-like structure.

12 Claims, 13 Drawing Sheets

Prior Art

Prior Art

Prior Art

Prior Art

SEMICONDUCTOR SWITCHING CIRCUIT DEVICE

BACKGROUND OF THE INVENTION

1. Field of the Invention

This invention relates to a semiconductor switching circuit device to be used for high-frequency switching applications and particularly to a semiconductor switching circuit device with improved isolation at high frequencies.

2. Description of the Related Art

Portable telephones and other mobile communication equipment use microwaves of the GHz band in many cases and switching elements for switching such high frequency signals are often used in a switching circuit for antennas and a circuit switching between transmitting and receiving, such as the ones described in Japanese Laid-Open Patent Publication No. Hei-9-181642. A field effect transistor (referred to hereinafter as "FET") formed on a substrate made of gallium arsenide (GaAs), which has many excellent characteristics for high frequency signal circuits, is used as the switching element in many cases. Monolithic microwave integrated circuits (MMIC), in which these switching elements are integrated, are being developed accordingly.

FIG. 10A shows a sectional view of a GaAs-based MESFET (metal-semiconductor field effect transistor). An N-type channel region 2 is formed by doping a surface part of an undoped GaAs substrate 1 with an N-type impurity, a gate electrode 3 is placed to be in Schottky contact with the channel region 2 surface, and source and drain electrodes 4 and 5, which are in ohmic contact with the GaAs surface, are placed at both sides of gate electrode 3. With this transistor, the potential of gate electrode 3 is used to form a depleted layer in the channel region 2 immediately below, and the channel current between the source electrode 4 and the drain electrode 5 is controlled thereby.

FIG. 10B is a basic circuit diagram of a compound semiconductor switching circuit device, which is called an SPDT (Single Pole Double Throw) and uses a GaAs FET.

The sources (or drains) of first and second FET's, FET1 and FET2, are connected to a common input terminal IN, the gates of FET1 and FET2 are connected to first and second control terminals Ctl-1 and Ctl-2, respectively, via resistors R1 and R2, respectively, and the drains (or sources) of FET1 and FET2 are connected to first and second output terminals OUT1 and OUT2, respectively. The signals that are applied to first and second control terminals Ctl-1 and Ctl-2 are complementary signals and the FET to which the H level signal is applied turns on to allow the signal applied to the input terminal IN to reach one of the output terminals. Resistors R1 and R2 are placed to prevent the high-frequency signal from leaking via the gate electrodes to the DC potential of the control terminals Ctl-1 and Ctl-2, which are AC grounded.

FIG. 11 shows an example of a compound semiconductor chip in which the compound semiconductor switching circuit device shown in FIG. 10 is integrated.

FET1 and FET2, which perform switching, are placed at the central parts of a GaAs substrate and resistors R1 and R2 are connected to the respective gate electrodes of the FET's. Also, electrode pads INPad, OUT1Pad, OUT2Pad, Ctl-1Pad, and Ctl-2Pad, corresponding to the common input terminae output terminals and the control terminals, respectively, are placed at peripheral parts of the substrate. A gate metal layer (Ti/Pt/Au) 20, which is formed at the same time as the forming of the gate electrodes of the respective FET's, is a second-layer wiring, indicated by dotted lines, and a pad metal layer (Ti/Pt/Au) 30, which connects the respective elements and forms the pads, is a third-layer wiring, indicated by solid lines. An ohmic metal layer (AuGe/Ni/Au), which is in ohmic contact with the substrate, is a first-layer wiring, and forms the source electrodes and drain electrodes of the respective FET's and take-out electrodes of the respective resistors. This layer is not illustrated in FIG. 11 as it overlaps with the pad metal layer.

FIG. 12A is an enlarged plan view of the FET1 shown in FIG. 11. The rectangular region surrounded by alternate long and short dash lines is a channel region 12 that is formed on the substrate 11. The third-layer pad metal layer 30, which takes on the form of comb teeth that extend from the left side, is a source electrode 13 (or drain electrode) that is connected to output terminal OUT1, and a source electrode 14 (or drain electrode), formed by the first-layer ohmic layer 10, is placed below the electrode 13. Also, the third-layer pad metal layer 30 part, which takes on the form of comb teeth that extend from the right side, is a drain electrode 15 (or source electrode) that is connected to common input terminal IN, and a drain electrode 16 (or source electrode), formed by the first-layer ohmic layer 10, is placed below the electrode 15. These electrodes are interdigitated and a gate electrode 17, formed on the channel region 12, is placed in between in the two electrodes.

A sectional view of a part of this FET is shown in FIG. 12B. An n-type channel region 12 and n+-type high concentration regions, which form a source region 18 and a drain region 19 at both sides of channel region 12, are formed on the substrate 11. The gate electrode 17 is placed on channel region 12, and the drain electrode 14 and the source electrode 16, which are made of the first-layer ohmic metal layer 10, are placed on the respective high concentration regions. The pad metal layer 30, which is the third and top layer wiring, also provides connection between the device elements.

FIGS. 13A and 13B show a section of a packaging structure for the semiconductor chip of FIG. 11. FIG. 13A shows a sectional view of the package, and FIG. 13B is a schematic magnified sectional of the packaged FET. A nitride film 50 is formed as a protective film over the entire surface of the chip except above the electrode pad used as the terminals. The compound semiconductor chip 63 is mounted on an island of lead 62 using a conductive paste 65, and the electrode pads of compound semiconductor chip 63 are connected to leads 62 by bonding wires 64. The semiconductor chip 63 is covered by a resin layer 80 using a mold die corresponding to the shape of the packaging. The tip parts of leads 62 extend out of the resin layer 80.

Because of the requirements for wireless networks that enable information transmission at higher density, the operation frequency of those switching circuits is shifting from the 2.4 GHz band to the 5 GHz band. However, it has become known that when the conventional compound semiconductor switching circuit device is used, the isolation becomes less than the designed value. In the conventional switching circuit shown in FIGS. 11 and 13B, when FET1 is on, FET2 is off. In other words, the high-frequency signal that is input into FET2 is not supposed to pass between the source and drain electrodes of FET2, that is, between the common input terminal IN and the output terminal OUT2. However, this is not the case in the conventional device. Because the source electrode—drain electrode distance is extremely fine, for example 3 $\mu$m, the high frequency signals pass between the two electrodes through the mold resin layer. Accordingly, the isolation is less than the designed value of the switching circuit.

This leakage of the high frequency signals is not much of problem at the frequency band of 2.4 GHz, as in the case of 2.4 GHz-band wireless LAN and Bluetooth applications, among other applications. However, the degradation of isolation becomes a major a problem at the high frequency band of 5 GHz or higher.

SUMMARY OF THE INVENTION

The invention provides a semiconductor switching circuit device that includes a field effect transistor having a source electrode, a gate electrode and a drain electrode, a first electrode pad connected to the source electrode or the drain electrode, and a second electrode pad connected to the source electrode or the drain electrode which is not connected to the first electrode pad. The device also includes a third electrode pad receiving a DC voltage and applying the DC voltage to the field effect transistor, a first insulating layer covering the field effect transistor, a metal layer disposed above the first insulating layer and connected to the third electrode pad, and a second insulating layer disposed on the metal layer.

The invention also provides a semiconductor switching circuit device for switching high frequency signals in response to a control signal. The device includes a first field effect transistor and a second field effect transistor, an electrode pad receiving the control signal and connected to the first field effect transistor or the second field effect transistor, an insulating layer disposed on the first and second field effect transistor, and a metal layer disposed above the first insulating layer and connected to the electrode pad.

The invention further provides a semiconductor switching circuit device that includes a field effect transistor having a source electrode, a gate electrode and a drain electrode, a signal input electrode pad receiving a high frequency signal and connected to the source electrode or the drain electrode, and a signal output electrode pad outputting the high frequency signal and connected to the source electrode or the drain electrode which is not connected to the signal input electrode pad. The device also includes a control electrode pad receiving a control signal and applying the control signal to the gate electrode, and means for preventing the high frequency signal from leaking between the source electrode and the drain electrode when the field effect transistor is switched off and the high frequency signal is applied to the signal input electrode pad.

DETAILED DESCRIPTION OF THE INVENTION

Semiconductor switching circuit device of the embodiments of this invention will be described with reference to FIGS. 1–9. Compound semiconductor switching devices are used as examples to describe these embodiments.

Figure 1:
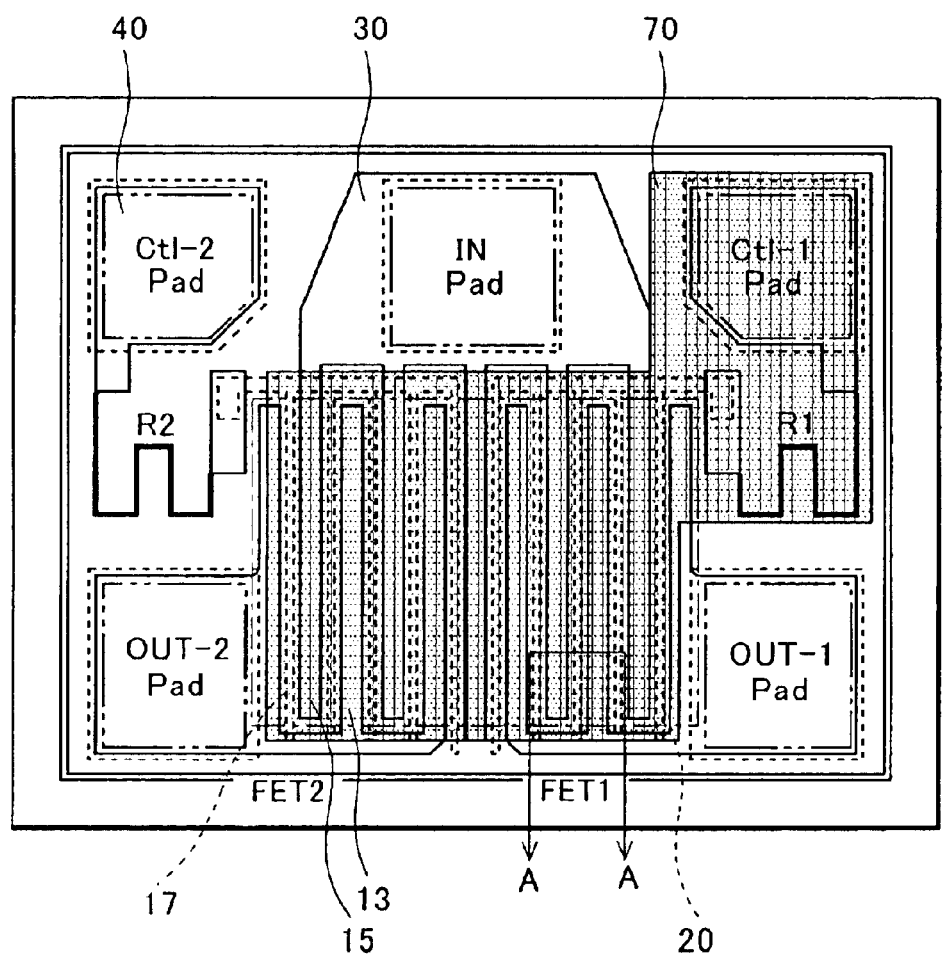
FIG. 1 is a plan view of a switching circuit device of a first embodiment of this invention.

FIG. 1 shows a compound semiconductor chip of a first embodiment of this invention. Switching transistors, FET1 and FET2, are placed at central parts of a GaAs substrate and resistors R1 and R2 are connected to the respective gate electrodes of the FET's. Also, electrode pads INPad, OUT1Pad, OUT2Pad, Ctl-1Pad, and Ctl-2Pad, corresponding to the common input terminal, the output terminals, and the control terminals, respectively, are placed at peripheral parts of the substrate. A gate metal layer (Ti/Pt/Au) 20, which is formed at the same time as the forming of the gate electrodes of the respective FET's, is a second-layer wiring, indicated by dotted lines, and a pad metal layer (Ti/Pt/Au) 30, which connects the respective elements and form the pads, is a third-layer wiring, indicated by solid lines. An ohmic metal layer (AuGe/Ni/Au), which is in ohmic contact with the substrate, is a first-layer wiring, and forms the source electrodes and drain electrodes of the respective FET's and take-out electrodes of the respective resistors. This layer is not illustrated in FIG. 1 as it overlaps with the pad metal layer.

Though not illustrated in the figure, a nitride film, which serves a protective film, is provided over the entire surface of the chip with the exception of the respective electrode pad parts, and an interlayer insulating film made of polyimide covers the nitride film. Polyimide has a low dielectric constant and can provide a low parasitic capacitance when the thickness of the layer is approximately 6 $\mu$m. Contact holes 40, indicated by the unevenly broken line, are formed to expose the electrode pads through the nitride film and the polyimide layer. Bonding wires are press-bonded onto the respective electrode pads.

Figure 12A:
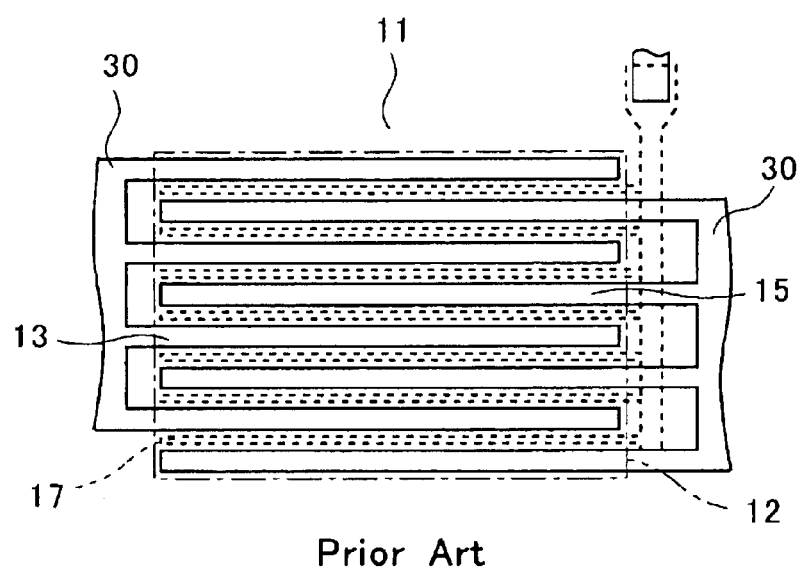
FIG. 12A is a partially expanded view of the switching circuit device of FIG. 11.
Figure 12B:
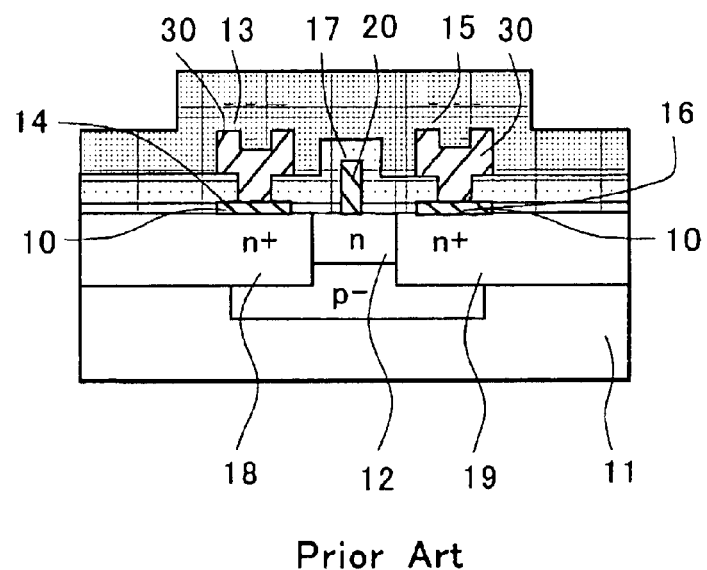
FIG. 12B is a partial sectional view of the switching circuit device of FIG. 11
Figure 13A:
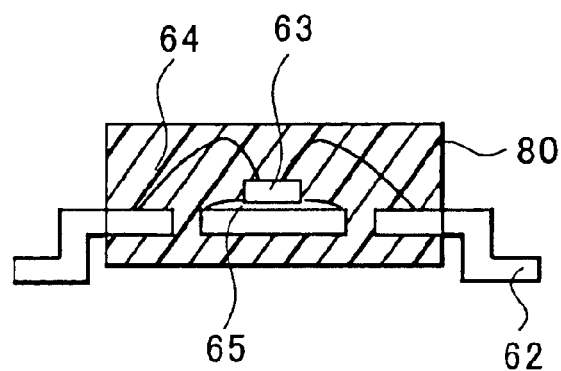
FIGS. 13A and 13B are sectional views of a packaging structure of the switching circuit device of FIG. 11.
Figure 13B:
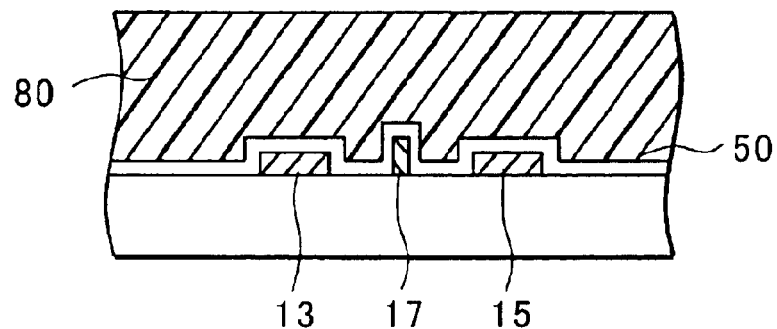

A shield metal 70, made of Ti/Pt/Au, is vapor-deposited on the polyimide layer to cover the entire surface of the two FET's, FET1 and FET2. The shield metal 70 extends to the control terminal electrode pad Ctl-1Pad, and covers the control terminal electrode pad Ctl-1Pad. The circuit diagram of the switching circuit device of FIG. 1 is the same as that of FIG. 10B. The structures of this switching circuit device underneath the shield metal 70 is the same as those described with respect to FIGS. 12A and 12B.

Figure 2A:
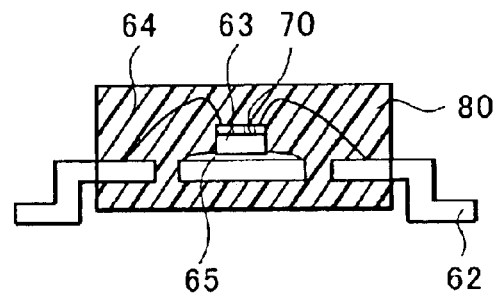
FIGS. 2A, 2B and 2C are sectional views of the switching circuit device of FIG. 1.
Figure 2B:
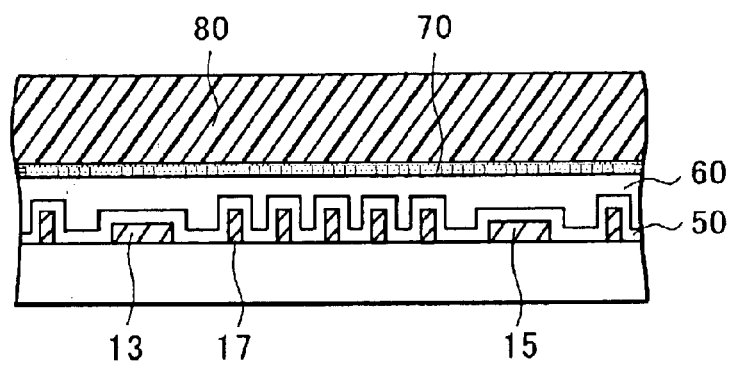
Figure 2C:
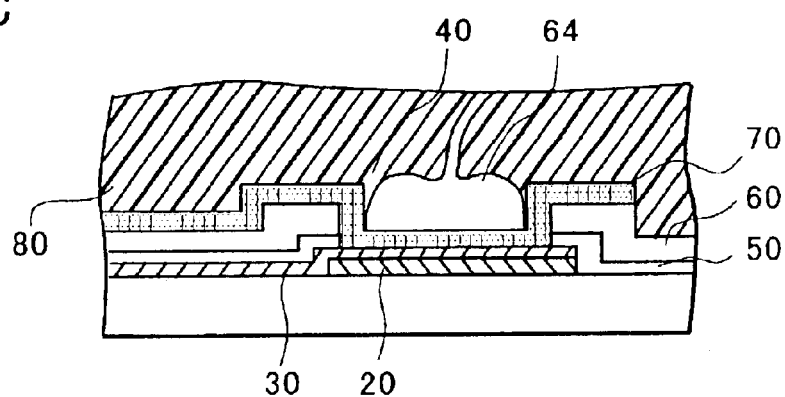

FIGS. 2A, 2B and 2C show sectional views of a packaging structure of the chip of FIG. 2 after resin molding. FIG.

2A is a sectional view of the packaging, FIG. 2B is a partially expanded sectional view of FIG. 2A to show the FET structure, and FIG. 2C is an expanded sectional view of FIG. 2A to show the electrode pad.

As shown in FIG. 2A, the compound semiconductor chip 63 of FIG. 1 is mounted on an island of lead 62 using a conductive paste 65. The respective electrode pads of the compound semiconductor chip 63 are connected to the leads 62 by bonding wires 64. The semiconductor chip 63 is covered by a resin layer 80, which is formed by die molding. The ends of the leads 62 extend out of the resin layer 80.

FIG. 2B schematically shows the structure of the packaging around the FET. The gate electrode 17 is placed between the source electrode 13 (or the drain electrode 15) used for signal input, and the drain electrode 15 (or the source electrode 13) used for signal output. As shown in FIG. 1, this structure is repeated to form the FET. The shield metal 70 covers the polyimide layer 60 over the entire surface of the FET's. In this structure, the source electrode 13, the drain electrode 15, and the gate electrode 17 are shielded from the resin layer 80 by the shield metal 70.

FIG. 2C shows a sectional view of the control terminal electrode pad Ctl-1Pad. The shield metal 70, which is formed above the FET, extends to the control terminal electrode pad Ctl-1Pad and covers the top surface of the control terminal electrode pad Ctl-1Pad, which is made of the gate metal layer 20 and the pad metal layer 30. The shield metal 70 is in direct contact with the terminal electrode pad through the contact holes 40 provided in the polyimide layer 60 and the nitride film 50. A bonding wire 64 is attached to the shield metal 70.

Since a switching operation is performed by applying a control signal of 0V or 3V to the control terminal Ctl-1, a DC potential of 3V or 0V is applied to the shield metal as well. Because a DC potential is practically a ground potential with respect to the high frequency signals used in this switching circuit device, the source electrode is shield from the drain electrode by this ground potential. In other words, the signal leaking path between the two electrodes through the resin layer 80 is cut off.

Figure 3A:
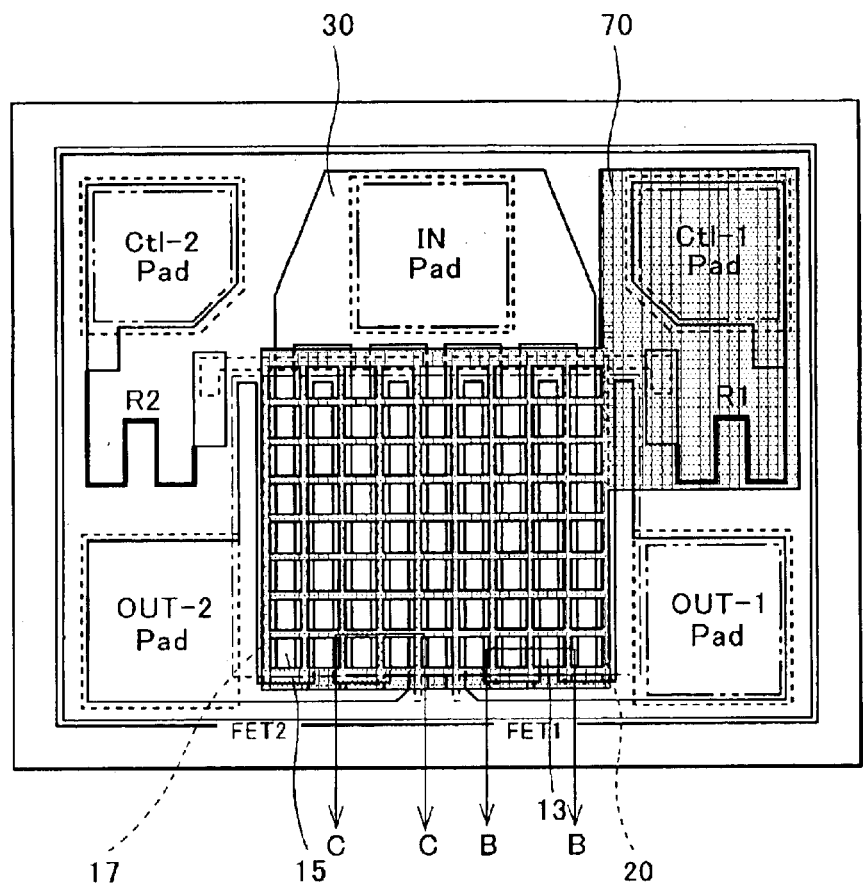
FIG. 3A is a plan view of a switching circuit device of a second embodiment of this invention.
Figure 3B:
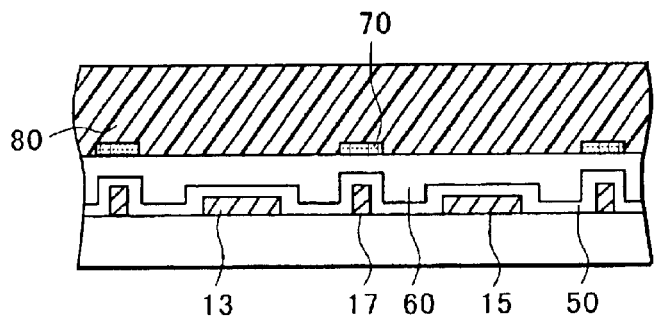
FIG. 3B is a sectional view of the switching device of FIG. 3A.

FIG. 3 shows a second embodiment of this invention. Although in the first embodiment, the shield metal above the FET's covers the entire surface of the FET's, in the second embodiment, the shield metal is formed in a lattice form with openings. Besides the difference in the configuration of the shield metal, the switching circuit device of this embodiment has the same structure as that of the first embodiment. FIG. 3A shows a plan view of this embodiment and FIG. 3B shows a sectional view along line B—B of FIG. 3A. The sectional structure along line C—C of FIG. 3A is the same as that of FIG. 2B. When the shield metal is provided over the entire surface of the two FET's as in the first embodiment, since the shield metal completely covers one of the two FET's that is switched on, a part of the signals that pass through this FET may be absorbed by the shield metal via the interlayer insulation film and the insertion loss may thus increase. In such a case, by forming the shield metal in the lattice form as shown in FIG. 3, the absorption of the high frequency signals by the shield metal can be properly suppressed and yet the leakage of the signals between the two electrodes of the FET that is switched off can be properly prevented. Though the shape of the shield metal is not restricted to the lattice form shown in FIG. 3A, it is preferable to position the shield metal at least between the source and drain electrode as shown in FIG. 3B.

Figure 4A:
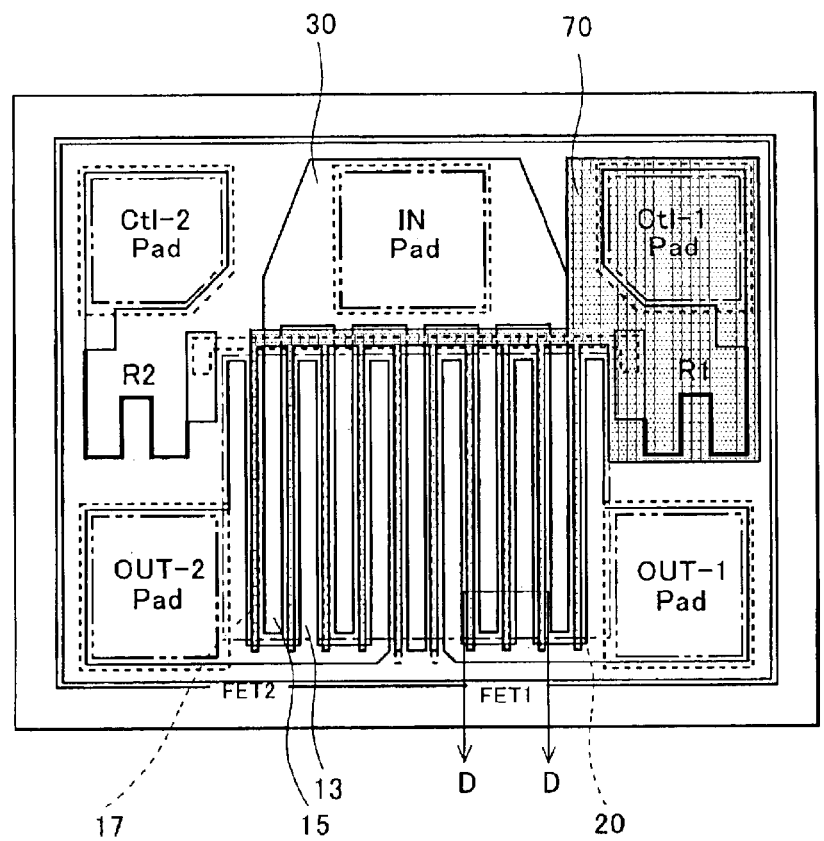
FIG. 4A is a plan view of a switching circuit device of a third embodiment of this invention.
Figure 4B:
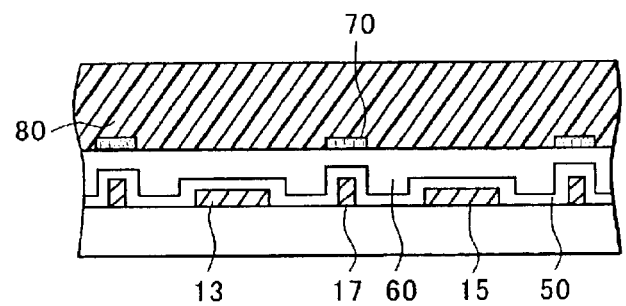
FIG. 4B is a sectional view of the switching device of FIG. 4A.

FIG. 4 shows a third embodiment of this invention. In this embodiment, the shield metal is provided only between the source and drain electrodes of the two FET's. FIG. 4A shows a plan view of this embodiment, and FIG. 4B shows a sectional view along line D—D of FIG. 4A. Besides the difference in the configuration of the shield metal, the switching circuit device of this embodiment has the same structure as that of the first embodiment. Because the signal leakage is only between the source and drain electrodes of the FET that is switched off, providing the shield metal in comb-teeth-form only above the area between the source and drain electrodes can effectively suppress the signal leakage, and yet minimize the absorption of the signals by the shield metal at the FET that is switched on.

The package structures of these embodiment are based on a punched-out frame and its transfer molding. However, these embodiments may also applied to a chip size package structure, in which a conductive pattern is formed on an insulating substrate and molding is performed in a batch.

The above embodiments use an SPDT device. However, these embodiments may be applicable to SPDT's with shunt FET's, high-power SPDT's, in which a plurality of FET's are connected in series, DPDT's having two input terminals and two output terminals and other switching circuit devices as long as they have a control terminal receiving a DC potential. Also, though in the above-described embodiment, the shield metal 70 is put in contact with the control terminal electrode pad Ctl-1Pad, it may obviously be in contact with the control terminal electrode pad Ctl-2Pad instead. Also, the shield metal 70 may be partitioned and be in contact with both control terminal electrode pads Ctl-1 and Ctl-2.

Figure 5A:
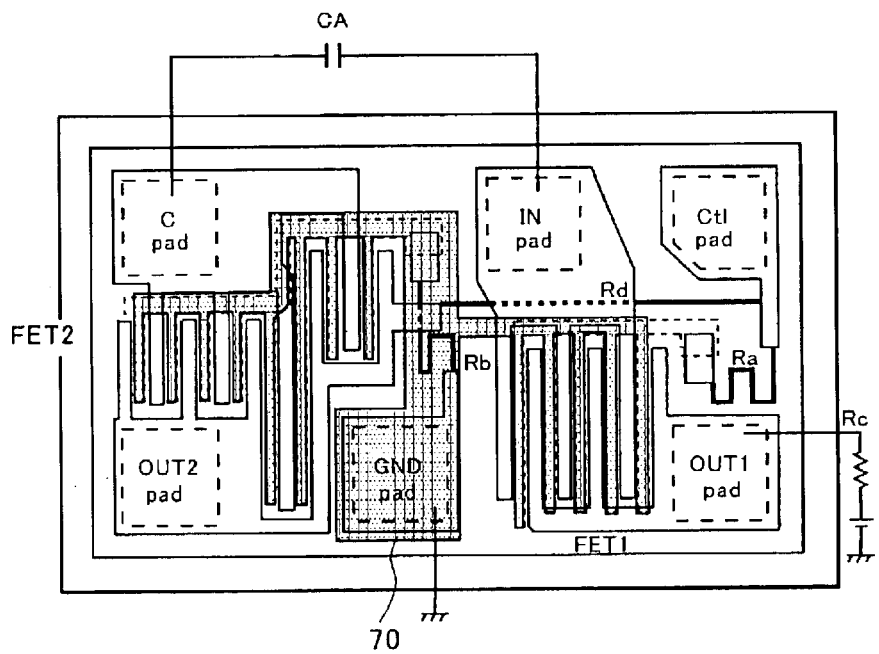
FIG. 5A is a plan view of a switching circuit device of a fourth embodiment of this invention.
Figure 5B:
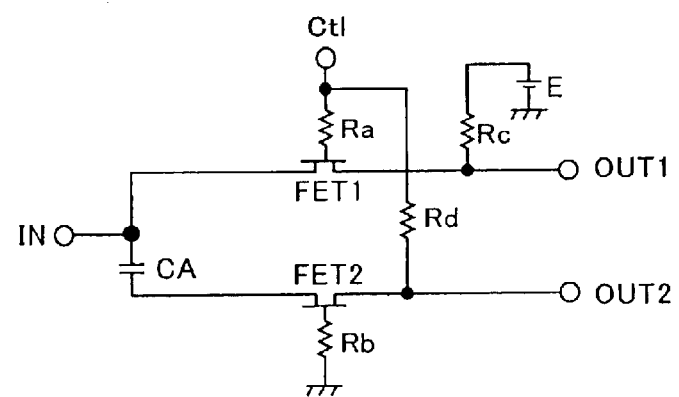
FIG. 5B is a circuit diagram of the switching circuit device of FIG. 5A.

FIGS. 5A and 5B show a fourth embodiment of this invention. FIG. 5A shows a chip layout, a 1-pin control switching circuit device, and FIG. 5B is a circuit diagram of this chip. The switching circuit device of FIG. 5A includes a ground terminal GND. In this configuration, the shield metal may also be connected to the DC potential terminal GND.

In this SPDT switch having only one control terminal single, when a control voltage applied to the control terminal is 0V, one of the two FET's is on and the other FET is off. When the control voltage is a positive voltage, the roles of the two FET's reversed. In this arrangement, a capacitor CA is used to achieve DC separation between the two FET's and prevent interference between the bias conditions. The gate electrode of FET1 and the source electrode or the drain electrode of FET2 are connected to control terminal Ctl via the resistors Ra and Rd, respectively. The gate electrode of FET2 is connected to the GND terminal via a resistor Rb, and the OUT1 terminal is connected to the power supply via a resistor Rc. Though the chip shown in FIG. 5A is provided with CA, Rc and the power supply as external elements, any of these external elements may be integrated into the chip.

The two FET's, FET1 and FET2, are placed at the left and right sides of a GaAs substrate. Electrode pads, Cpad, INpad, and CTLPad, corresponding to a capacitance terminal, a common input terminal, and the single control terminal, respectively, are placed at the upper side, and electrode pads, OUT1Pad, GNDPad, and OUT2Pad, corresponding to output terminals and the ground terminal, respectively, are provided at the lower side. A second-layer wiring, which is indicated by dotted lines, is a gate metal layer (Ti/Pt/Au) 20, which is formed at the same time as the forming of the gate electrodes of the respective FET's and a third-layer wiring, which is indicated by solid lines, is a pad metal layer (Ti/Pt/Au) 30, which forms the connections and pads of the respective elements. An ohmic metal layer (AuGe/Ni/Au), which is in ohmic contact with the first-layer substrate, forms the source electrode and drain electrode of the respective FET's and take-out electrodes of the respective resistor.

Though the shield metal is placed above the portions between the source electrodes and drain electrodes of the FET's in FIG. 5A, the shield metal may be placed over the entire surface as shown in FIG. 1 or in a lattice-form as shown in FIG. 3A, and put in contact with the GND pad. If a power supply pad is built in, the shield metal may be in contact with the power supply pad and not in contact with the GND pad. By putting the shield metal in contact with the power supply pad or GND pad, the DC potential applied to the shield metal does not change. In comparison, the DC potential of the shield metal put in contact with a control pad changes constantly, for example, between 0V and 3V, and may create a noise for the high frequency signals. The switching circuit device of this embodiment, however, eliminates this problem because the DC potential of the shield metal does not change.

Figure 6:
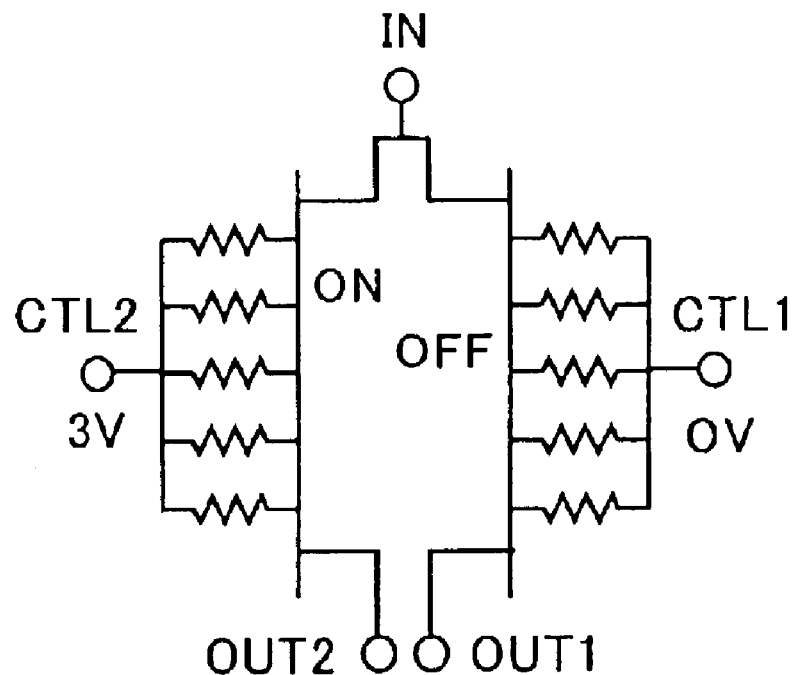
FIG. 6 is a circuit diagram of a switching circuit device of a fifth embodiment of this invention.
Figure 10A:
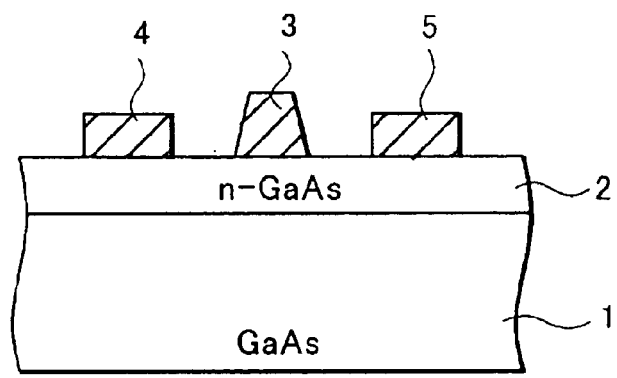
FIG. 10A is a schematic sectional view of a conventional switching circuit device.
Figure 10B:
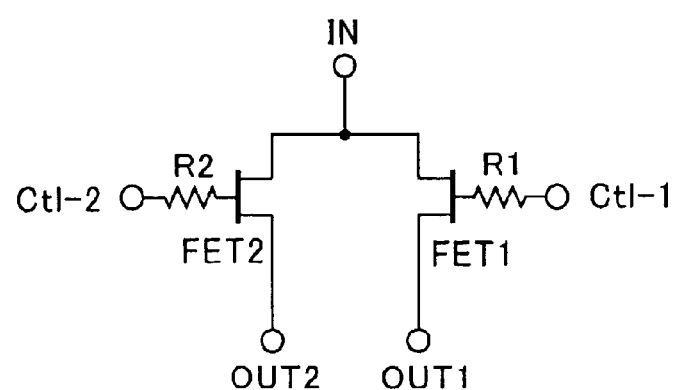
FIG. 10B is a circuit diagram of the device of FIG. 10A.
Figure 11:
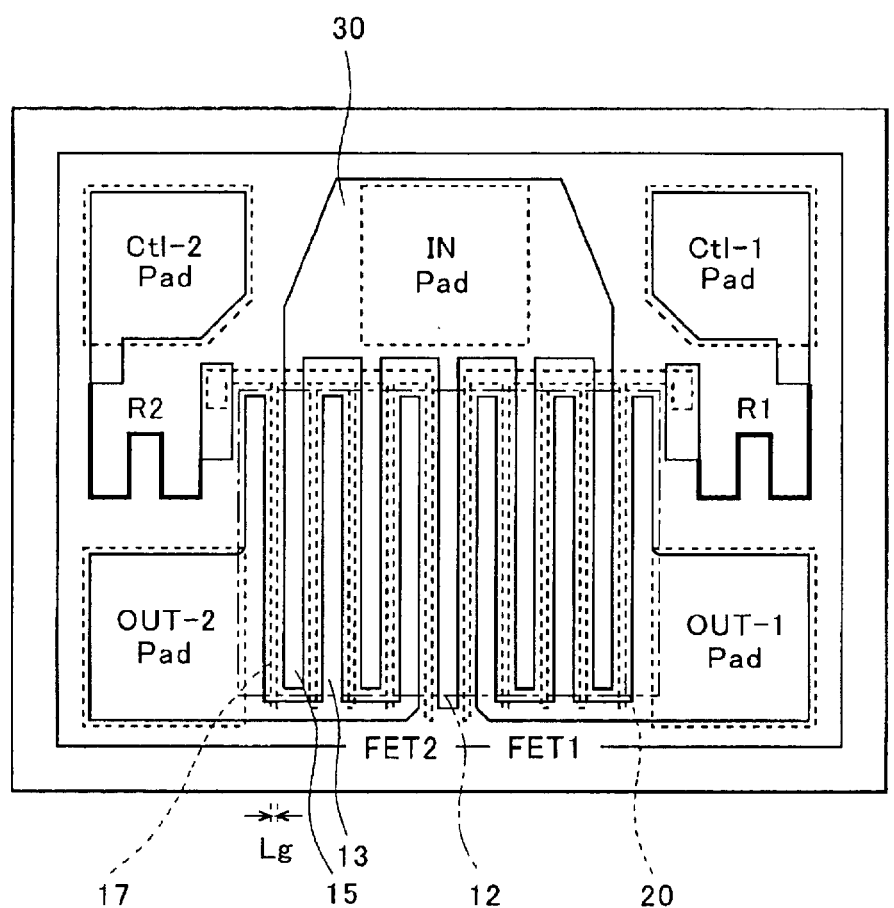
FIG. 11 is a plan view of the switching circuit device of FIG. 10A.

A fifth embodiment of this invention is described with reference to FIGS. 6–9. In this embodiment, the shield metal is placed over the entire surface of FET's with a multi-gate structure for high power switch. FIG. 6 shows a circuit diagram of a switching circuit device that uses a multi-gate structure FET for high power switch applications. If a maximum linear output power that exceeds the capacity of the switching circuit device shown in FIGS. 10B and 11 is required, the maximum linear output power can be increased, for example, by connecting two or more FET's in series for both FET's. However, since the chip area will, significantly increase if the number of FET's is simply increased, a multi-gate type FET is used to provide a structure that achieves the maximum linear output power without significantly increasing the chip area. Though the principles of the operation of this switching circuit device are basically the same as those of the arrangement shown in FIG. 10B, the significant difference is that five gate electrodes are located between the source electrode and drain electrode.

Figure 7:
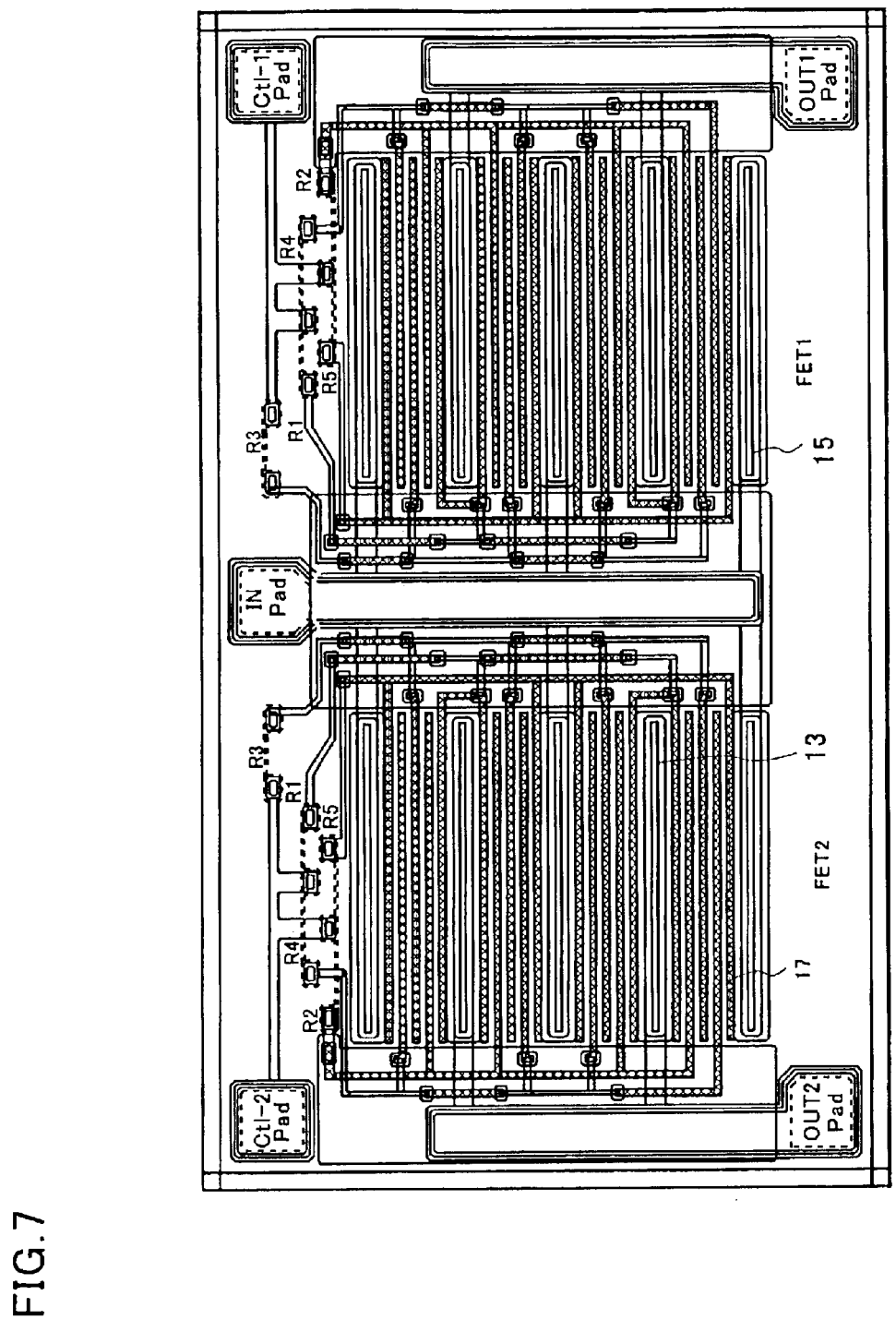
FIG. 7 is a plan view of the switching circuit device of FIG. 6 without a shield metal layer.

FIG. 7 shows the compound semiconductor switching IC chip of this embodiment, which uses a multi-gate structure FET to provide the circuit of FIG. 6.

The two FET's, FET1 and FET2, are placed on a GaAs substrate and resistors R1, R2, R3, R4 and R5 are connected to the respective gate electrodes of the FET's. Also, electrode pads INPad, OUT1Pad, OUT2Pad, Ctl-1Pad, and Ctl-2Pad, respectively corresponding to the common input terminal, the output terminals, and the control terminals, respectively, are placed at peripheral parts of the substrate.

The five gate electrodes are placed between the source and drain electrodes, as first through fifth gate electrodes. Each of the five electrodes is connected to the corresponding gate electrode of the other five gate electrode group. Resistors R1, R2, R3, R4, and R5 are connected to the first to fifth gate electrodes, respectively. For each FET, all five resistors are connected to the corresponding control terminal electrode pads.

Although the source electrode and the drain electrode are placed between the groups of the five gate electrodes, the region between two gate electrodes of the five electrode group acts as a source electrode or a drain electrode, thus providing the same effect as that of serially connecting five FET's having a single gate electrode. This provides the effect of obtaining a maximum linear voltage amplitude of five times and thus a maximum linear output power of 25 times, as a square of the maximum linear voltage amplitude, in comparison to a switching circuit device using an FET with a single gate electrode.

Figure 8:
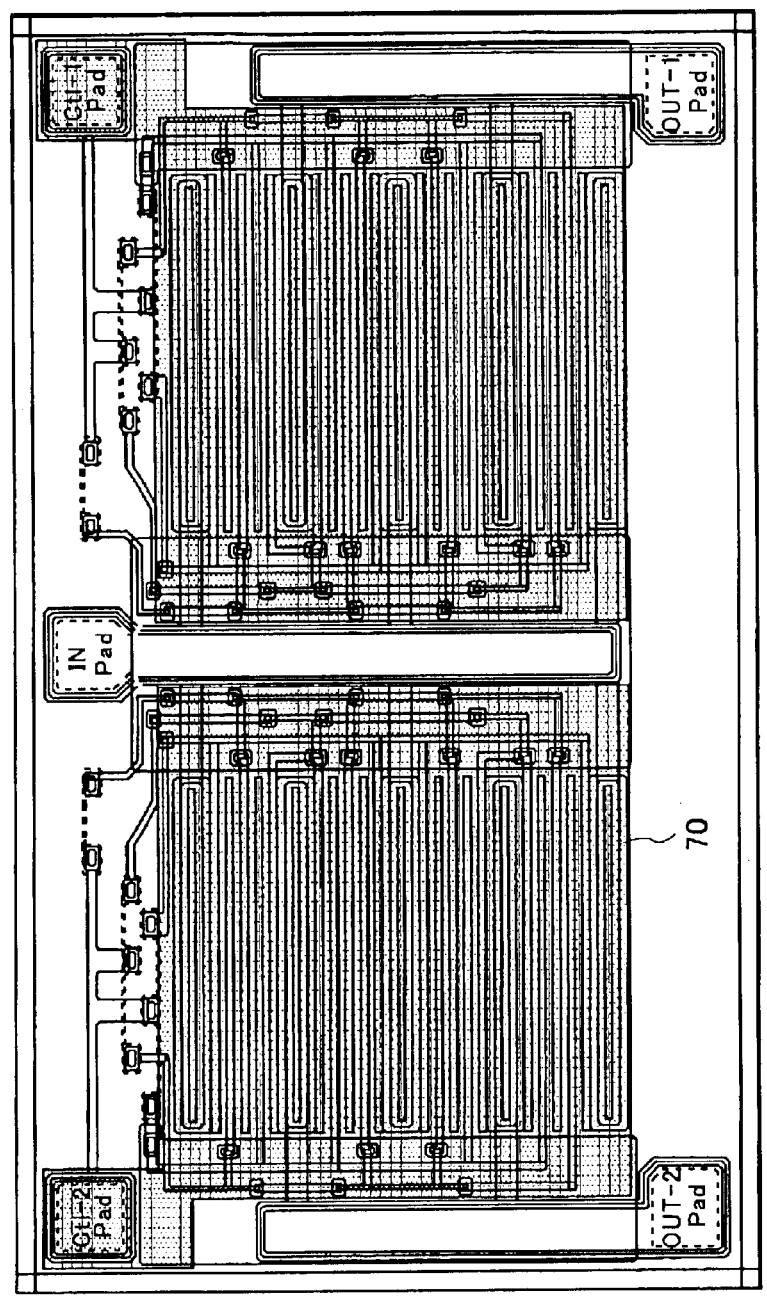
FIG. 8 is a plan view of the switching circuit device of FIG. 6 with the shield metal layer.

FIG. 8 shows an arrangement in which the chip of FIG. 7 is provided with a shield metal. A nitride film, which serves as a protective film, is provided over the entire surface of the chip except the respective electrode pads, and a polyimide layer 60, which serves as an interlayer insulating film, is provided above the nitride film. The contact holes are formed to expose the corresponding electrode pads, as is the case with structure shown in FIG. 2C. Bonding wires are furthermore press-bonded onto the electrode pads.

A shield metal 70 made of Ti/Pt/Au is vapor-deposited on the polyimide layer 60 to cover the entire surface of the two FET's, FET1 and FET2. The shield metal 70 extends to the control terminal electrode pads Ctl-1Pad and Ctl-2Pad, and contacts the control terminal electrode pads Ctl-1Pad and Ctl-2Pad through the contact holes.

Figure 9A:
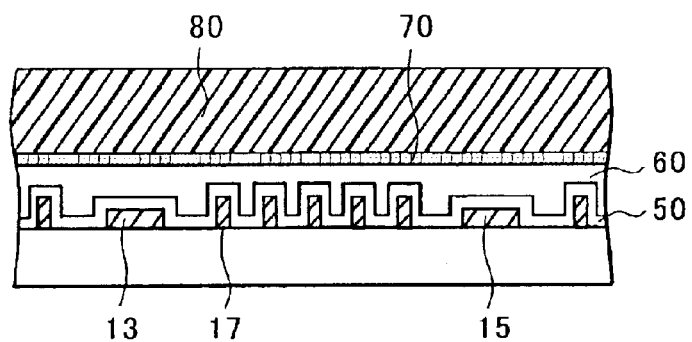
FIGS. 9A, 9B and 9C are sectional views of the switching device of FIG. 8

FIG. 9A shows a schematic sectional view of a part of the FET of FIG. 8. This section corresponds to line A—A in FIG. 1. Except that there are five gate electrodes between the source and drain electrodes, the detailed structure of the FET below the shield metal is the same as that shown in FIG. 12B. As shown in FIG. 9A, five gate electrodes are placed between the source and drain electrodes. In this configuration, the shield metal 70 is placed over the entire surface of the FET's, and this chip is packaged as shown in FIGS. 2A–2C. Although the signal leakage of the FET that is switched off tends to occur more often in a high power application, the structure of FIG. 9A effectively prevents this leakage.

Figure 9B:
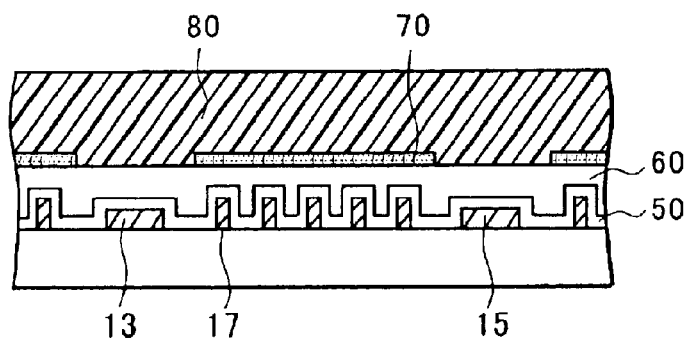
Figure 9C:
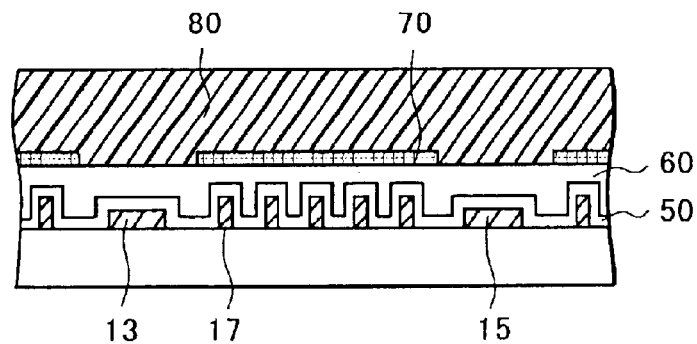

FIG. 9B is a sectional view of the switching circuit device of FIG. 7 with the lattice form shield metal, such as the one shown in FIG. 3. FIG. 9B corresponds to the section along line B—B in FIG. 3. FIG. 9C shows a sectional view of the switching device of FIG. 7 with the comb-like shield metal, such as the one shown in FIG. 4. FIG. 9A corresponds to the section along line D—D in FIG. 4. The structures of FIGS. 9B and 9C in comparison to the structure of FIG. 9A achieve the same effect as those of FIGS. 3 and 4 in comparison to that of FIG. 1.

Although the switching circuit devices based on a compound semiconductor are described above, the embodiments above are applicable to switching circuit devices based on silicon semiconductor as well.

What is claimed is:

1. A semiconductor switching circuit device comprising:
   a field effect transistor comprising a source electrode, a gate electrode and a drain electrode;
   a first electrode pad connected to the source electrode or the drain electrode;
   a second electrode pad connected to the source electrode or the drain electrode which is not connected to the first electrode pad;
   a third electrode pad receiving a DC voltage and applying the DC voltage to the field effect transistor;
   a first insulating layer covering the field effect transistor;
   a metal layer disposed above the first insulating layer and connected to the third electrode pad; and
   a second insulating layer disposed on the metal layer.

2. The semiconductor switching circuit device of claim 1, wherein the metal layer is disposed between the source electrode and the drain electrode.

3. The semiconductor switching circuit device of claim 1, wherein the metal layer is disposed to cover the entire field effect transistor.

4. The semiconductor switching circuit device of claim 2, wherein the metal layer is formed in a lattice form.

5. The semiconductor switching circuit device of claim 1, wherein the third electrode pad is configured to receive a control signal.

6. The semiconductor switching circuit device of claim 1, wherein the third electrode pad is grounded.

7. The semiconductor switching circuit device of claim 1, wherein the third electrode pad is connected to a power source.

8. The semiconductor switching circuit device of claim 1, wherein the gate electrode comprises a plurality of electrodes disposed between the source electrode and the drain electrode.

9. The semiconductor switching circuit device of claim 1, wherein the field effect transistor includes a channel layer formed on a compound semiconductor substrate.

10. The semiconductor switching circuit device of claim 1, wherein the metal layer is in direct contact with the top surface of the third electrode pad and a bonding wire is attached to the portion of the metal layer covering the third electrode pad.

11. A semiconductor switching circuit device for switching high frequency signals in response to a control signal, comprising:

a first field effect transistor and a second field effect transistor;

an electrode pad receiving the control signal and connected to the first field effect transistor or the second field effect transistor;

an insulating layer disposed on the first and second field effect transistor; and a metal layer disposed above the first insulating layer and connected to the electrode pad.

12. A semiconductor switching circuit device comprising:

a field effect transistor comprising a source electrode, a gate electrode and a drain electrode;

a signal input electrode pad receiving a high frequency signal and connected to the source electrode or the drain electrode;

a signal output electrode pad outputting the high frequency signal and connected to the source electrode or the drain electrode which is not connected to the signal input electrode pad;

a control electrode pad receiving a control signal and applying the control signal to the gate electrode; and means for preventing the high frequency signal from leaking between the source electrode and the drain electrode when the field effect transistor is switched off and the high frequency signal is applied to the signal input electrode pad.

* * * * *